United States Patent
Fullwood et al.

(10) Patent No.: US 12,512,837 B2
(45) Date of Patent: Dec. 30, 2025

(54) SYSTEM AND METHOD FOR FORMING RADIATION HARDENED CIRCUITRY

(71) Applicant: CERIUM LABORATORIES LLC, Austin, TX (US)

(72) Inventors: Clayton Fullwood, Austin, TX (US); Timothy Hossain, Austin, TX (US)

(73) Assignee: CERIUM LABORATORIES LLC, Austin, TX (US)

( * ) Notice: Subject to any disclaimer, the term of this patent is extended or adjusted under 35 U.S.C. 154(b) by 603 days.

(21) Appl. No.: 18/008,176

(22) PCT Filed: Jun. 4, 2021

(86) PCT No.: PCT/US2021/036009
§ 371 (c)(1),
(2) Date: Dec. 4, 2022

(87) PCT Pub. No.: WO2021/248072
PCT Pub. Date: Dec. 9, 2021

(65) Prior Publication Data
US 2023/0275585 A1    Aug. 31, 2023

Related U.S. Application Data

(60) Provisional application No. 63/034,876, filed on Jun. 4, 2020.

(51) Int. Cl.
*H03K 19/00* (2006.01)
*G11C 5/00* (2006.01)
*H01L 23/556* (2006.01)
*H03K 19/003* (2006.01)

(52) U.S. Cl.
CPC ......... *H03K 19/0033* (2013.01); *G11C 5/005* (2013.01); *H01L 23/556* (2013.01)

(58) Field of Classification Search
USPC .......................................... 716/118, 119, 136
See application file for complete search history.

(56) References Cited

U.S. PATENT DOCUMENTS

| | | | |
|---|---|---|---|
| 10,840,087 B2* | 11/2020 | Weimer | H01J 37/32449 |
| 2012/0043483 A1* | 2/2012 | Bowen, III | G21F 1/02 |
| | | | 250/517.1 |
| 2017/0205704 A1* | 7/2017 | Nikipelov | G03F 7/70958 |
| 2022/0206170 A1* | 6/2022 | Hossain | H10F 30/298 |

* cited by examiner

Primary Examiner — Brian Ngo

(57) ABSTRACT

A semiconductor component includes a substrate including a plurality of source/drain implants in the form of rows and a charge storage structure disposed over the substrate. The charge storage structure includes at least three continuous layers including a first silicon oxide layer, a silicon nitride layer disposed on the first silicon oxide layer, and a second silicon oxide layer disposed on the silicon nitride layer. The semiconductor component further includes a plurality of gate structures in the form of columns disposed over the charge structure and extending perpendicular to the rows and further includes a radiation protection layer disposed over the charge storage structure and the plurality of gate structures. The radiation protection layer includes a radiation resistant material including boron having an isotope composition of at least 90% boron-11.

20 Claims, 7 Drawing Sheets

SYSTEM AND METHOD FOR FORMING RADIATION HARDENED CIRCUITRY

CROSS-REFERENCE TO RELATED APPLICATION(S)

This application claims benefit of U.S. Provisional Application No. 63/034,876, filed Jun. 4, 2020, which is incorporated herein by reference in its entirety.

FIELD OF THE DISCLOSURE

This disclosure, in general, is directed to systems and methods for forming radiation hardened circuitry.

BACKGROUND

Conventional semiconductor devices are susceptible to various forms of radiation. When exposed to radiation, the devices may change state or worse, be damaged beyond usability. As such, there is increasing interest in semiconductor devices that are resistant to radiation.

One such radiation is alpha particle radiation which can change the state of a memory cell or other charge storage structures, resulting in errored calculations or erroneous data. Alpha particles can result from spontaneous decay of certain isotopes. In another example, neutron radiation, such as thermal neutron radiation, can instigate decay of certain isotopes, which results in the omission of alpha particles. Such alpha particles can disrupt the operation of the devices.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an embodiment, a semiconductor component includes a substrate in which source/drain implants form a set of rows. A charge storage structure is formed over the substrate. In an example, the charge storage structure includes a silicon oxide layer, a silicon nitride layer disposed over the silicon oxide layer, and a further silicon oxide layer disposed over the silicon nitride layer. The charge storage structure can be a continuous structure disposed over the set of source/drain rows. Gate columns are formed over the charge storage structure. In particular, the gate columns extend perpendicular to the source drain rows. The gate columns can be formed of a polycrystalline silicon material and optionally include a silicide layer. A radiation protection layer can be disposed over the gate columns and the charge storage structure. In particular, the radiation protection layer can surround the gate columns on at least three sides and cover regions of the charge storage structure not covered by the gate columns. The radiation protection layer can be formed of materials including boron and having an isotope composition of at least 90% boron-11. Metal layers can be formed over the radiation protection layer that can provide access to interconnects that connect to the source/drain rows or gate columns.

In a further embodiment, a method for forming a semiconductor device includes implanting a set of source/drain rows into a semiconductor substrate. The method can further include forming a charge storage structure extending continuously over the source/drain rows. Gate material can be deposited over the charge storage structure and patterned into gate columns that extend perpendicular to the source drain rows. Silicide may be formed on a top surface of the gate columns. A radiation protection layer can be formed over the charge storage structure and the gate columns. For example, the radiation storage structure can surround the gate columns on at least three sides and cover the charge structure in areas not covered by the gate columns. The radiation protection layer can be formed of a material including boron having an isotope composition of at least 90% boron-11. Metal layers and interconnects can be formed over the radiation protection layer.

Figure 1:
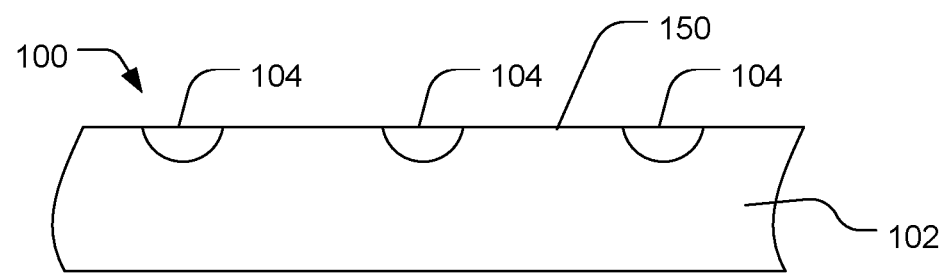
FIG. 1 includes an illustration of a cross-section of a semiconductor workpiece.
Figure 2:
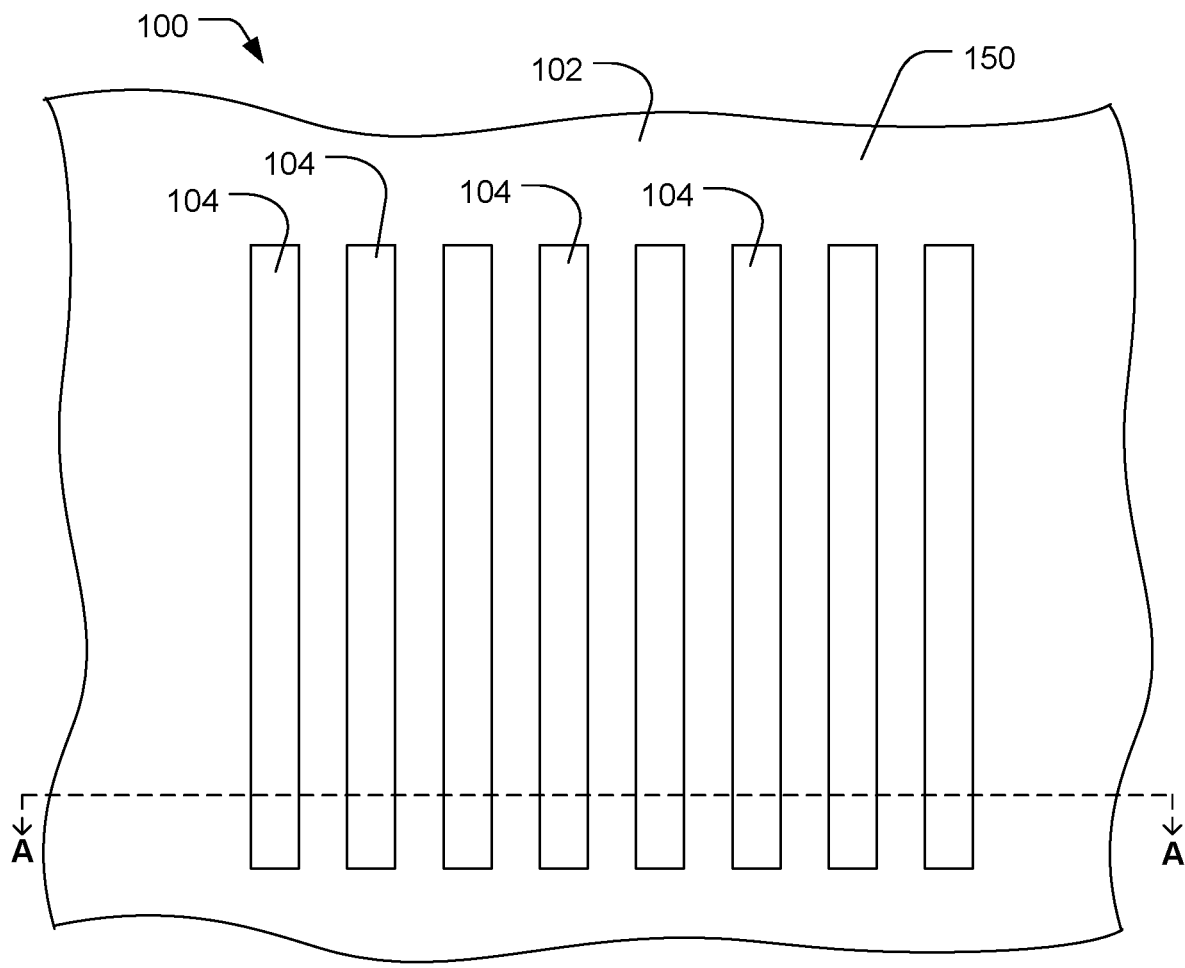
FIG. 2 includes a plan view illustration of the semiconductor workpiece of FIG. 1.

FIG. 1 and FIG. 2 include illustrations of an example workpiece 100. FIG. 1 depicts a cross-section A indicated in the plan view of FIG. 2. In an example, the workpiece 100 includes a semiconductor substrate 102. The substrate 102 can be formed of silicon, such as monocrystalline silicon. In another example, the substrate can be formed from materials, such as a gallium arsenide. In an example, the substrate is formed as or doped to be a p-type substrate. Alternatively, the substrate can be doped to form an n-type substrate.

A set of source/drain implants can be formed as a plurality of rows 104 within the substrate 102. For example, when the substrate 102 is a p-type substrate, and n-type implant can be used to form the source/drain implants. Example ions for n-type implants include phosphorus, arsenic, or antimony. Alternatively, the substrate can have an n-type configuration and the implants can be p-type implants, such as boron or indium ion implants. In particular, the implant ions can be selected for isotopes that are less likely to decay into alpha particles. For example, boron materials for forming ions to be implanted can have an isotope composition that is predominantly boron-11, with little or no boron-10.

In particular, the set of rows defined by the source/drain implants extend parallel to each other within a plane parallel to a plane defined by a top surface 150 of the substrate 102. In an example, masking layers can be formed over the substrate, establishing openings in a pattern that permits the formation of implants in the form of rows. Following implanting, the mask is removed, leaving the workpiece 100 as illustrated in FIG. 1 and FIG. 2. In an example, the set of rows can include at least 3 rows. For example, the set of rows can include 3 rows, 4 rows, 8 rows, 16 rows, 32 rows, any number between these numbers, or more rows.

Figure 3:
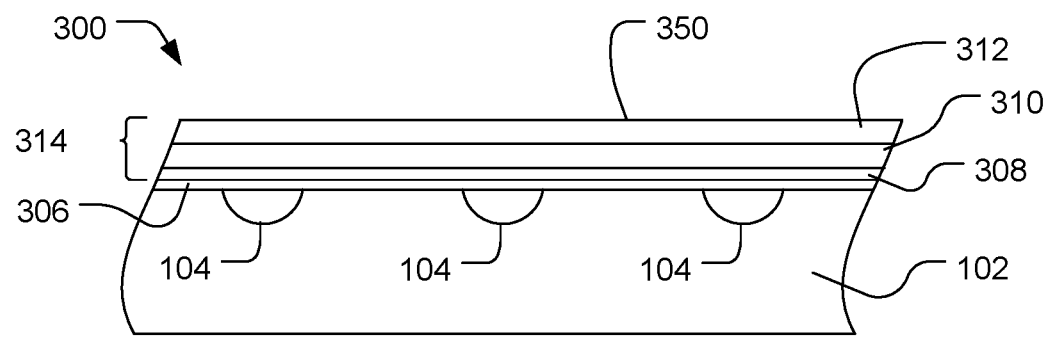
FIG. 3 includes a further illustration of a cross-section of an example semiconductor workpiece.
Figure 4:
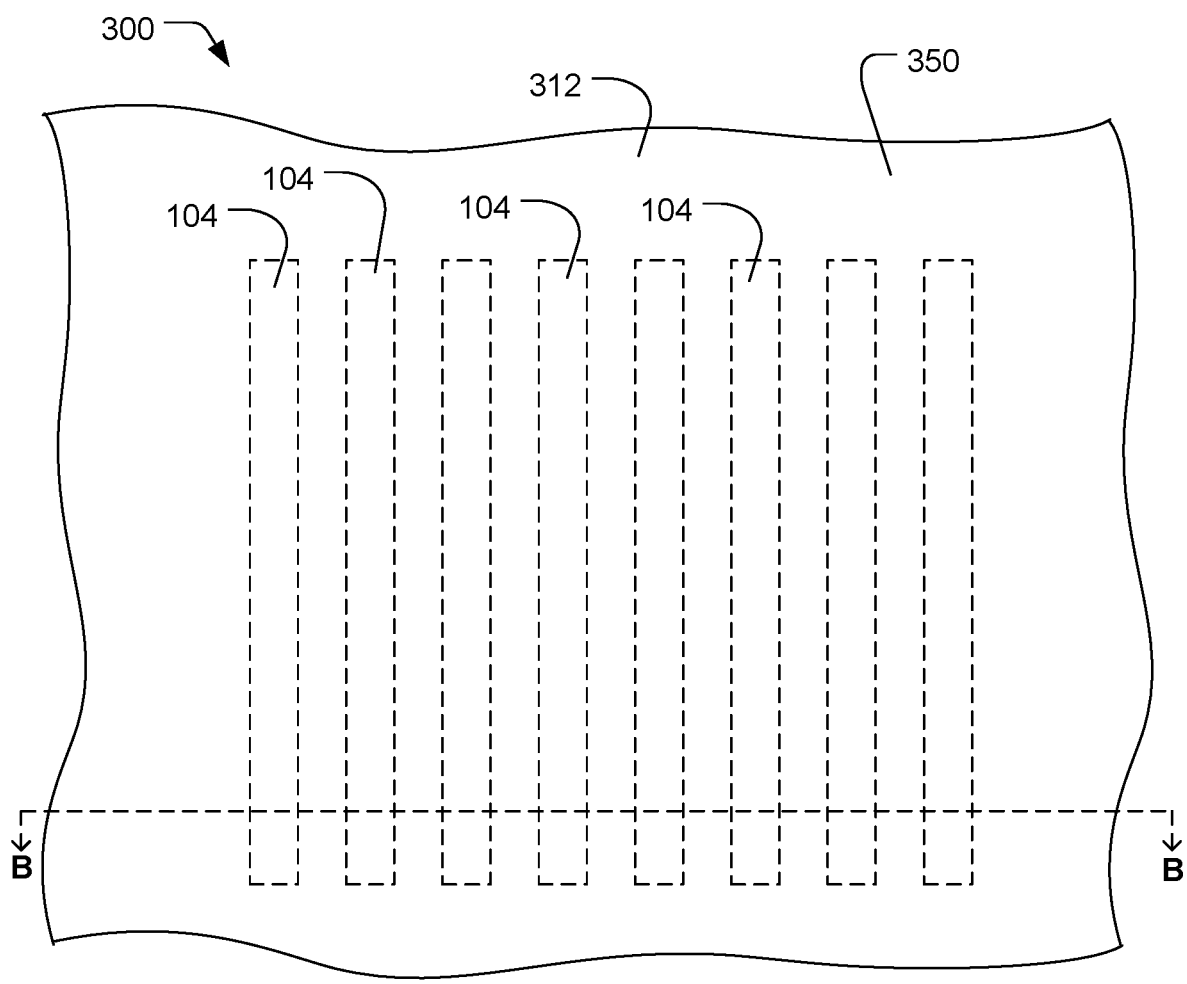
FIG. 4 includes an illustration of a plan view of the workpiece of FIG. 3.

A charge storage structure can be formed over the substrate 102. For example, FIG. 3 and FIG. 4 include illustrations of a workpiece 300 after subsequent processing. FIG. 3 includes an illustration of the cross-section at cut B of FIG. 4. A continuous charge storage structure 314 can be formed over the semiconductor substrate 102. In an example, the charge storage structure 314 is formed directly over or in direct contact with top surface of the substrate 102, for example, without intervening layers. Alternatively, one or more layers can be disposed between the charge storage structure 314 and the substrate 102. For example, a native oxide layer 306 can be disposed between the charge storage structure 314 and the substrate 102.

The charge storage structure 314 can include a plurality of continuous layers that extend over the set of source/drain implants forming rows 104 within the substrate 102. In particular, the layers of the charge storage structure 314 extend within a plane parallel to the top surface 150 of the semiconductor substrate 102 and over each row of the set of source/drain row implants 104.

The charge storage structure 314 can be formed of at least three layers. For example, the charge storage structure 314 can include a first silicon oxide layer 308. A silicon nitride layer 310 can be disposed over and in direct contact with the silicon oxide layer 308. In addition, a silicon oxide layer 312 can be formed over and in direct contact with the silicon nitride layer 310. In an example, the charge storage structure 314 is formed by applying an oxide of silicon layer 308 over the semiconductor layer 102 using low-pressure chemical vapor deposition (LPCVD) in an oxygen-rich atmosphere. In particular, the oxide may be deposited using low-pressure chemical vapor deposition (LPCVD) of silane and nitrous oxide in a nitrogen atmosphere. The nitride layer 310 can also be deposited using low-pressure chemical vapor deposition (LPCVD) using hexamethyldisiloxane and ammonia gas. A silicon oxide or oxynitride layer 312 can be grown over the nitride layer 310, for example, in an oxidation furnace.

The charge storage structure 314 can have a thickness in a range of 10 nm to 50 nm, such as a range of 10 nm to 30 nm. In particular, the oxide layer 308 can have a thickness in a range of 0.5 nm to 5 nm, such as a range of 1 nm to 4 nm, or even a range of 1 nm to 3 nm. The nitride layer 310 can have a thickness in a range of 3 nm to 10 nm, such as a range of 3 nm to 7 nm, or even a range of 4 nm to 6 nm. In a further example, the oxide layer 312 can have a thickness in a range of 2 nm to 20 nm, such as a range of 3 nm to 15 nm, or even a range of 5 nm to 10 nm.

Figure 5:
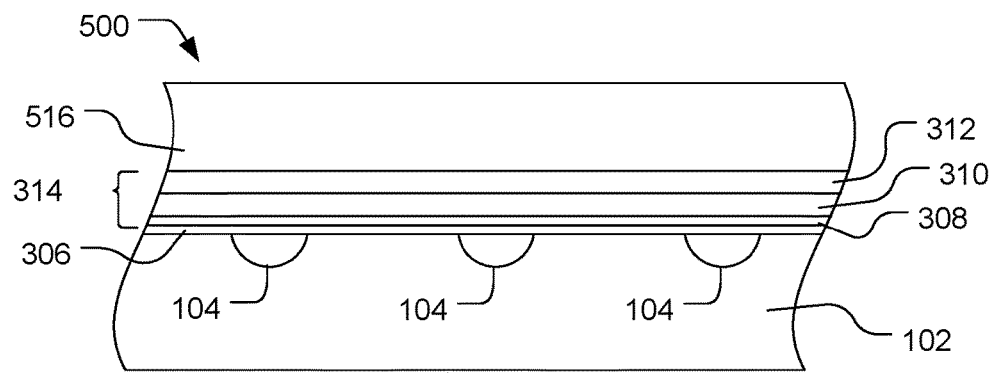
FIG. 5 includes an illustration of a cross-section of a further workpiece.
Figure 6:
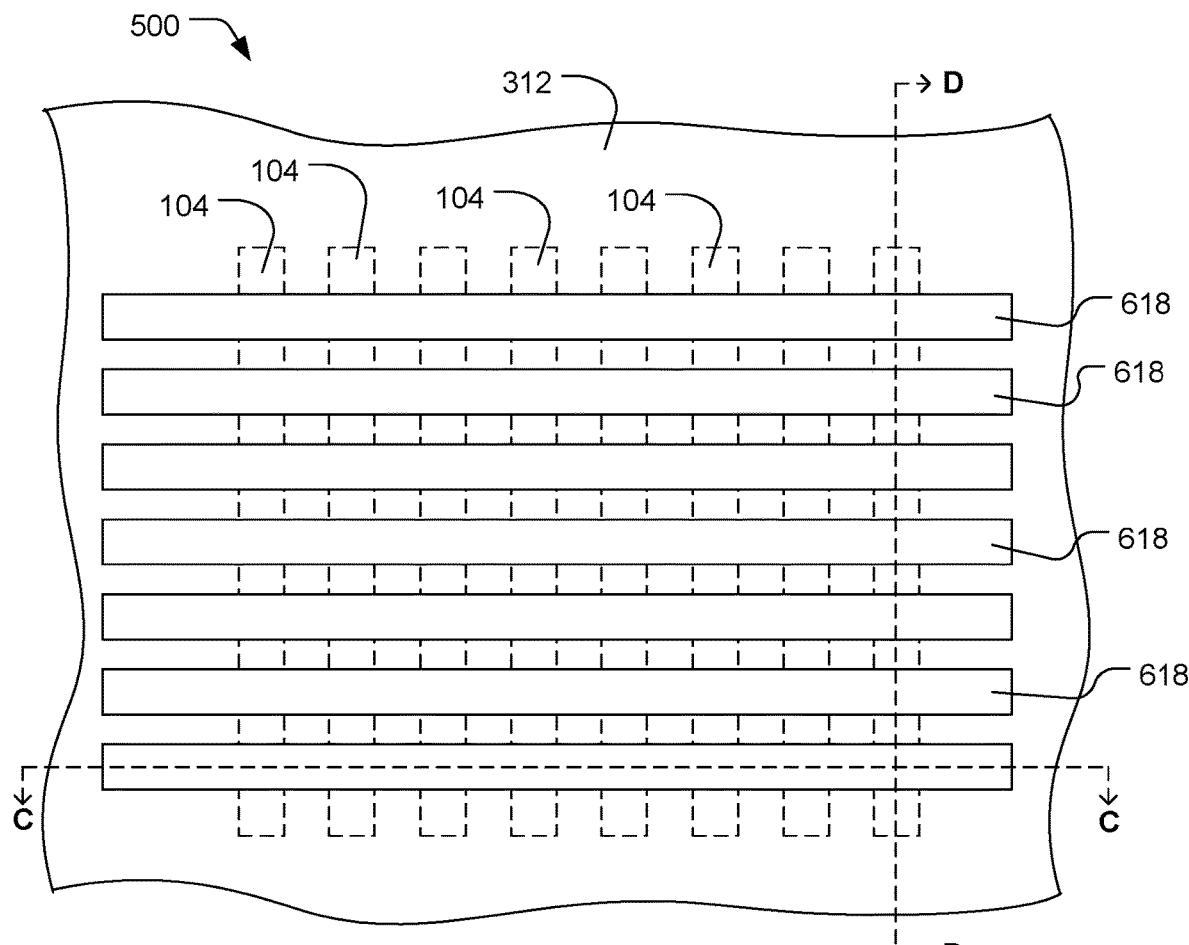
FIG. 6 includes a plan view illustration of the workpiece of FIG. 5.

FIG. 5 and FIG. 6 include illustrations of a further workpiece 500. A gate material 516 can be deposited over a top surface 350 (FIG. 3) of the continuous charge storage structure 314. The gate material 516 can be patterned into gate stacks in the form of gate columns 618. In an example, the gate columns 618 extend horizontally in a plane parallel to an upper surface 150 of the substrate 102 and the upper surface 350 of the charge storage structure 314 and extend perpendicular to the orientation of the source/drain rows 104. The continuous charge storage structure 314 and associated layers extend over a plurality of the source/drain rows or extend under a plurality of gate structures.

In an example, the gate material 516 can include polycrystalline silicon, such as a doped polycrystalline silicon. For example, the polycrystalline silicon can be doped with phosphorous. The polycrystalline silicon can be deposited using CVD, LPCVD, or PECVD. In an example, the thickness of the gate material layer 516 is in a range of 10 nm to 250 nm, such as a range of 20 nm to 220 nm, or even a range of 50 nm to 200 nm.

Figure 7:
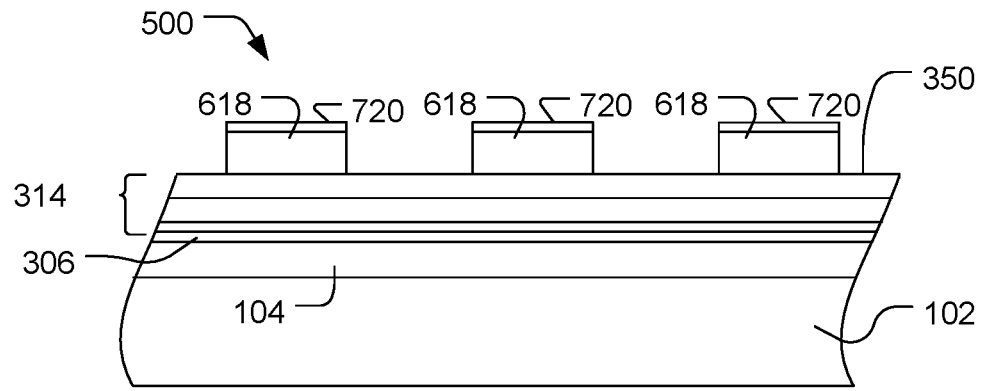
FIG. 7, FIG. 8, and FIG. 9 include cross-sections of example workpieces.

Optionally, a top surface of the gate columns 618 can be treated to form a silicide 720 (FIG. 7). A silicide forming metal, such as cobalt, nickel, rhenium, ruthenium, palladium, or a combination thereof, can be deposited by sputtering to a thickness in a range of 5 nm to 30 nm, followed by rapid thermal annealing.

FIG. 7 illustrates the gate stacks 618 and optional silicide layer 720 when viewed from the cross-section at cut D of FIG. 6. As illustrated, the gate stacks expose regions of the top surface 350 of the continuous charge storage structure 314.

Figure 8:
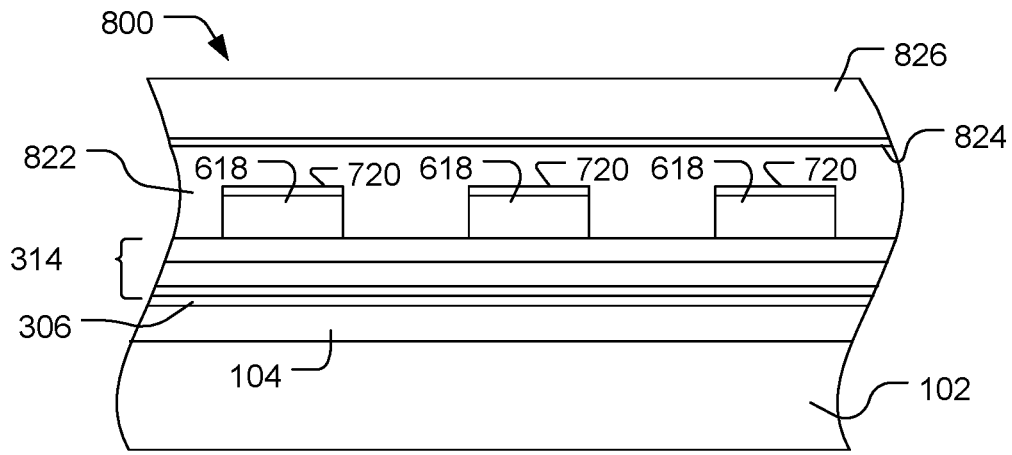
Figure 9:
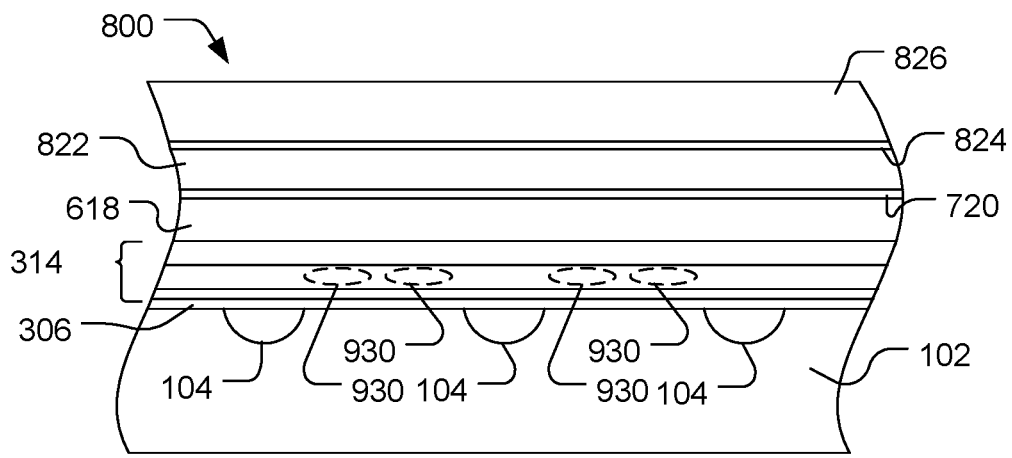

Turning to FIG. 8 and FIG. 9, in the workpiece 800, a radiation protection layer 822 can be formed over the gate columns 618 and the charge storage structure 314, such as over a top surface 350 of the silicon oxide layer 312. In particular, the radiation protection layer 822 extends over at least three sides of the gate columns 618 and across the exposed surface 350 of the continuous silicon oxide layer 312 of the charge storage structure 314. Optionally, the gate columns can have silicon oxide sidewalls (not illustrated) or silicon nitride spacers (not illustrated).

In an example, the radiation protection layer includes a radiation resistant material incorporating boron. For example, radiation resistant material can include boron in an isotope composition of at least 90% boron-11. The isotope composition is expressed as a percentage of atoms of a particular isotope. For example, the isotope composition can be at least 95% boron-11, such as at least 97% boron-11, or at least 99% boron-11. In a further example, the isotope composition is at least 99.5% boron-11, such as at least 99.7% boron-11, or even at least 99.9% boron-11.

In an example, the radiation resistant material can include borosilicate glasses, boron-doped phosphosilicate glass, or a boron ceramic material, such as boron oxide, boron nitride, boron carbide, or a combination thereof. In an example, the radiation resistant material includes a phosphosilicate glass that is selectively implanted with boron-11 after the phosphosilicate glass is formed by chemical vapor deposition (CVD). In particular, the radiation resistant material is a boron ceramic, such as boron oxide, boron nitride, boron carbide, or a combination thereof. For example, the radiation resistant material is boron oxide. In another example, the radiation resistant material is boron nitride. In a further example, the radiation resistant material is boron carbide.

A barrier layer 824 can be formed over the radiation protection layer 822. In addition, one or more metallization layers 826 can be formed over the radiation protection layer 822. Such metallization layers 826 can be used to provide electrical communication between interconnects that connect to source/drain implants or gate columns Interconnects (not illustrated) to provide access to source/drain rows or gate columns can be formed throughout the process and connected to the metallization layers 826.

In a particular embodiment, the charge storage structure 314 can be used along with the source/drain rows 104 and the gate columns 618 to form memory devices. In an example, the charge storage structure 314 forms a charge storage region disposed between rows of the source/drain implants. In a particular example, the charge storage structure 314 can define two charge storage regions 930 disposed between each pair of source/drain row implants 104 where they intersect with a gate column 618, for example, at cut C illustrated in FIG. 6.

In practice, activation of a gate column with a high voltage and activation of a source/drain row as a drain introduces charge into a charge storage region 930 of the charge storage structure 314 closest to the drain. Activation of the same gate column and activation of a source/drain pair (activation of adjacent source/drain rows with different charges) allows reading of the charge storage region 930 in the charge storage structure 314 closest to the source.

Figure 10:
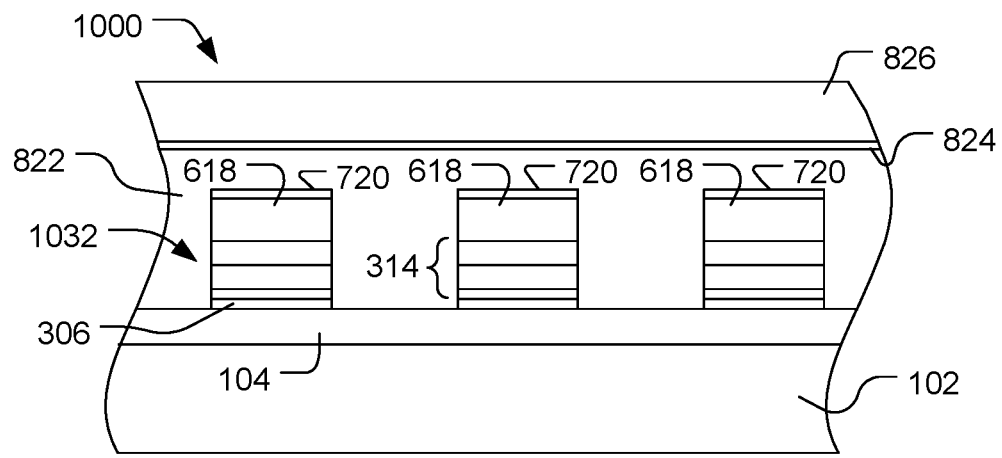
FIG. 10 and FIG. 11 include further examples of semiconductor devices.

FIG. 10 illustrates an alternative embodiment 1000 in which the charge storage structure 314 is etched with the gate material to form gate stacks 1032 incorporating both the gate material 618 and the charge storage structure 314. In such an example, the radiation protection layer 822 surrounds the gate stack 1032 on at least three sides. Optionally, silicon oxide sidewalls (not illustrated) can be formed on the gate stack 1032. In a further example, silicon nitride spacers (not illustrated) can be formed on either side of the gate stack 1032.

Figure 11:
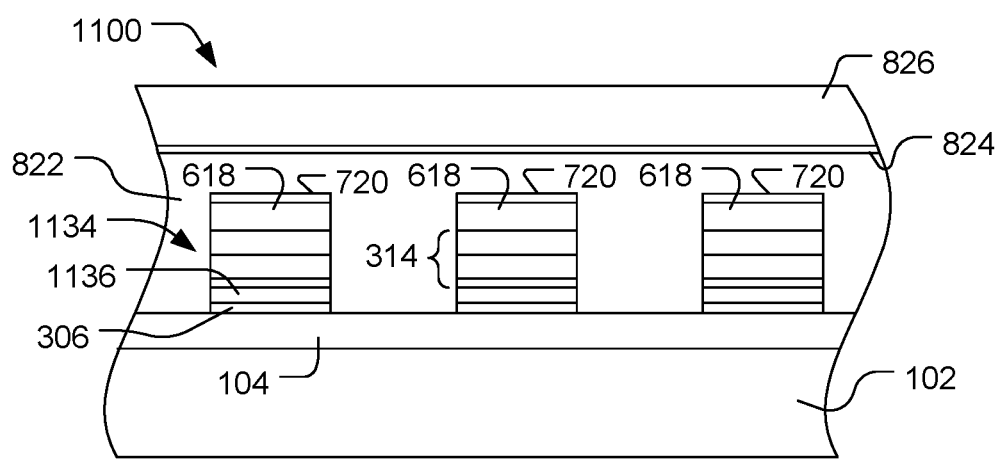

FIG. 11 includes a further embodiment in which additional layers are disposed between the charge storage structure 314 and the substrate 102 within each of the gate stacks 1134. For example, an optional polycrystalline silicon layer 1136 can be formed between native oxide layer 306 and the oxide layer 308 of the charge storage structure 314. Optional silicon oxide sidewalls (not illustrated) can be formed around the gate stack 1134, and silicon nitride spacers (not illustrated) can be formed on the sides of the gate stack 1134. The radiation protection layer can surrounds the gate stacks 1134 on at least three sides including the polycrystalline silicon 618, the charge storage structure 314, and the optional polycrystalline silicon layer 1136.

Figure 12:
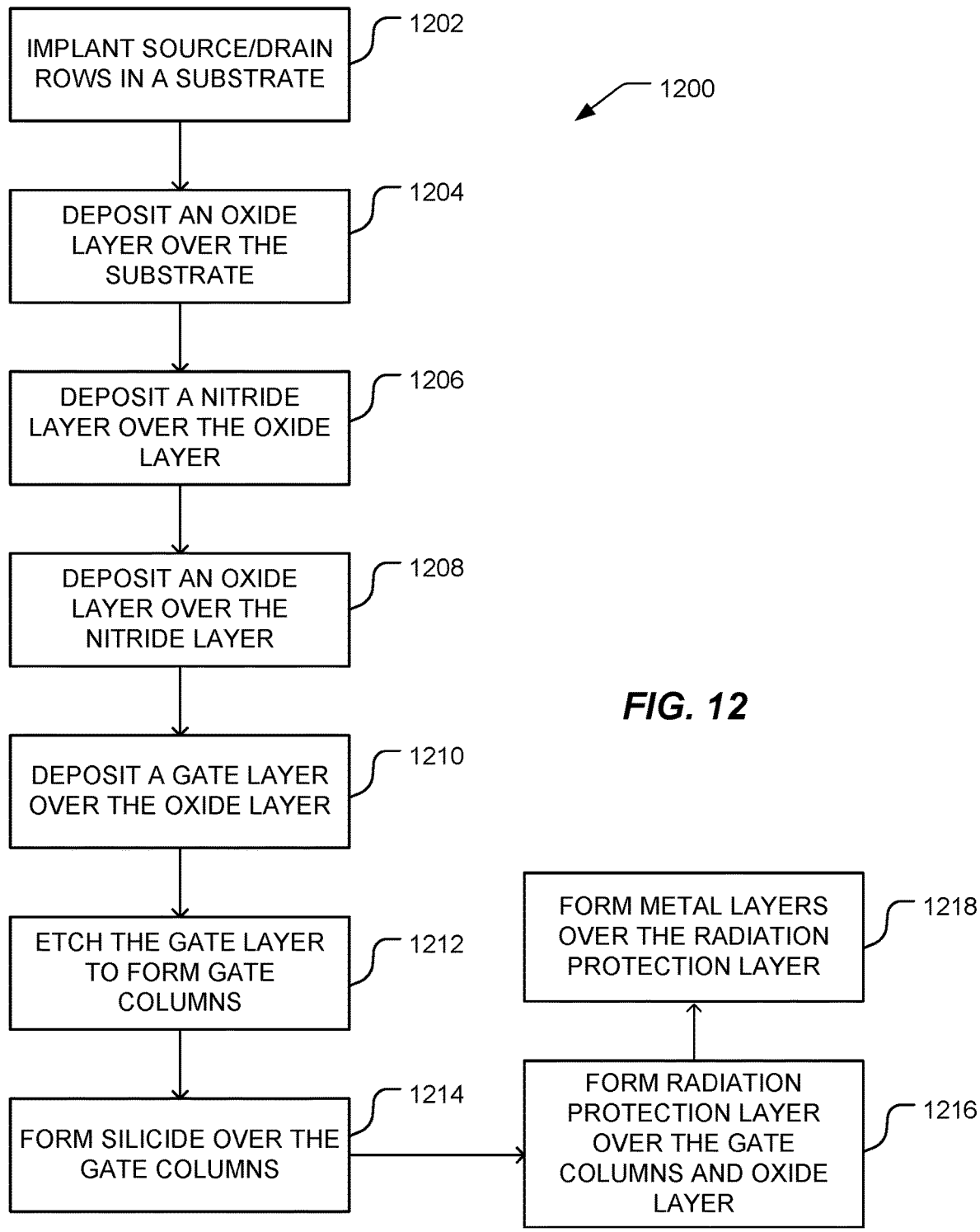
FIG. 12 includes a flow diagram illustrating an example method for forming a semiconductor component.

FIG. 12 includes an illustration of an example method 1200 for forming a radiation hardened device. As illustrated at block 1202, source/drain rows can be implanted into a substrate. For example, the substrate can be a monocrystalline silicon substrate. The substrate can be a p-type substrate into which n-type source/drain rows are implanted. In another example, the substrate can be an n-type substrate into which p-type source/drain rows are implanted.

A charge storage structure can be formed over the substrate and the source/drain rows. In particular, the charge storage structure can be formed by depositing an oxide layer over the substrate, as illustrated at block 1204. The silicon oxide layer can be deposited directly on the substrate. Alternatively, the silicon oxide layer can be deposited over intervening layers disposed over the substrate. In an example, the silicon oxide layer is formed using low-pressure chemical vapor deposition (LPCVD) in an oxygen-rich atmosphere. In particular, the oxide may be deposited using low-pressure chemical vapor deposition (LPCVD) of silane and nitrous oxide in a nitrogen atmosphere.

A silicon nitride layer can be deposited over the silicon oxide layer, as illustrated at block 1206. For example, the silicon nitride layer can be deposited to directly contact the silicon oxide layer. The silicon nitride layer can be deposited using low-pressure chemical vapor deposition (LPCVD) using hexamethyldisiloxane and ammonia gas.

A further silicon oxide layer can be deposited or formed over the silicon nitride layer, for example, directly contacting the silicon nitride layer without intervening layers, as illustrated at block 1208. The silicon oxide or oxynitride layer can be grown over the silicon nitride layer, for example, in an oxidation furnace. Accordingly, the charge storage structure is formed from at least the oxide/nitride/oxide layers.

A gate material layer can be deposited over the oxide layer or the charge storage structure, for example, over the top silicon oxide layer, as illustrated at block 1210. In an example, the gate material layer includes polycrystalline silicon. The polycrystalline silicon can be deposited using CVD, LPCVD, or PECVD.

As illustrated at block 1212, the gate layer can be etched to form gate columns. The gate columns can extend in a plane parallel to an upper surface of the substrate and perpendicular to the orientation of the source drain rows. In particular example, the gate columns extend over a continuous charge storage structure defined by continuous silicon oxide/nitride/oxide layers that extend in a plane parallel to the upper surface of the substrate. Optionally, the gate material layer can be doped either before etching or after etching.

Optionally, silicide can be formed over the gate columns, as illustrated at block 1214. A silicide forming metal, such as cobalt, nickel, rhenium, ruthenium, palladium, or a combination thereof, can be deposited by sputtering to a thickness in a range of 5 nm to 30 nm, followed by rapid thermal annealing.

A radiation protection layer can be formed over the gate columns and the charge storage structure, as illustrated at block 1216. The radiation protection layer can be formed of a radiation protection or resistant material, including boron, for example, having a composition and isotope composition of at least 90% boron-11. For example, the isotope composition can be at least 95% boron-11, such as at least 97% boron-11 or at least 99% boron-11. In a further example, the isotope composition is at least 99.5% boron-11, such as at least 99.7% boron-11 or at least 99.9% boron-11.

In an example, the radiation resistant material can include borosilicate glasses, boron-doped phosphosilicate glass, or a boron ceramic material, such as boron oxide, boron nitride, boron carbide, or a combination thereof. In an example, the radiation resistant material includes a phosphosilicate glass that is selectively implanted with boron-11 after the phosphosilicate glass is formed by chemical vapor deposition (CVD). In particular, the radiation resistant material is a boron ceramic, such as boron oxide, boron nitride, boron carbide, or a combination thereof. For example, the radiation resistant material is boron oxide. In another example, the radiation resistant material is boron nitride. In a further example, the radiation resistant material is boron carbide.

As illustrated at block 1218, one or more metal layers can be formed over the radiation protection layer and can be patterned to define electrical connections to interconnects that connect to the source/drain rows or the gate columns. Interconnects (not illustrated) to provide access to source/drain rows or gate columns can be formed throughout the process and connected to the one or more metal layers.

Figure 13:
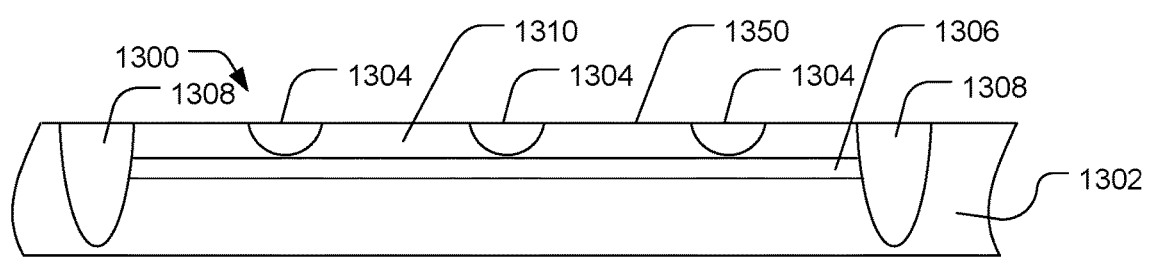
FIG. 13 includes an illustration of a cross-section of an example radiation protected substrate workpiece.
Figure 14:
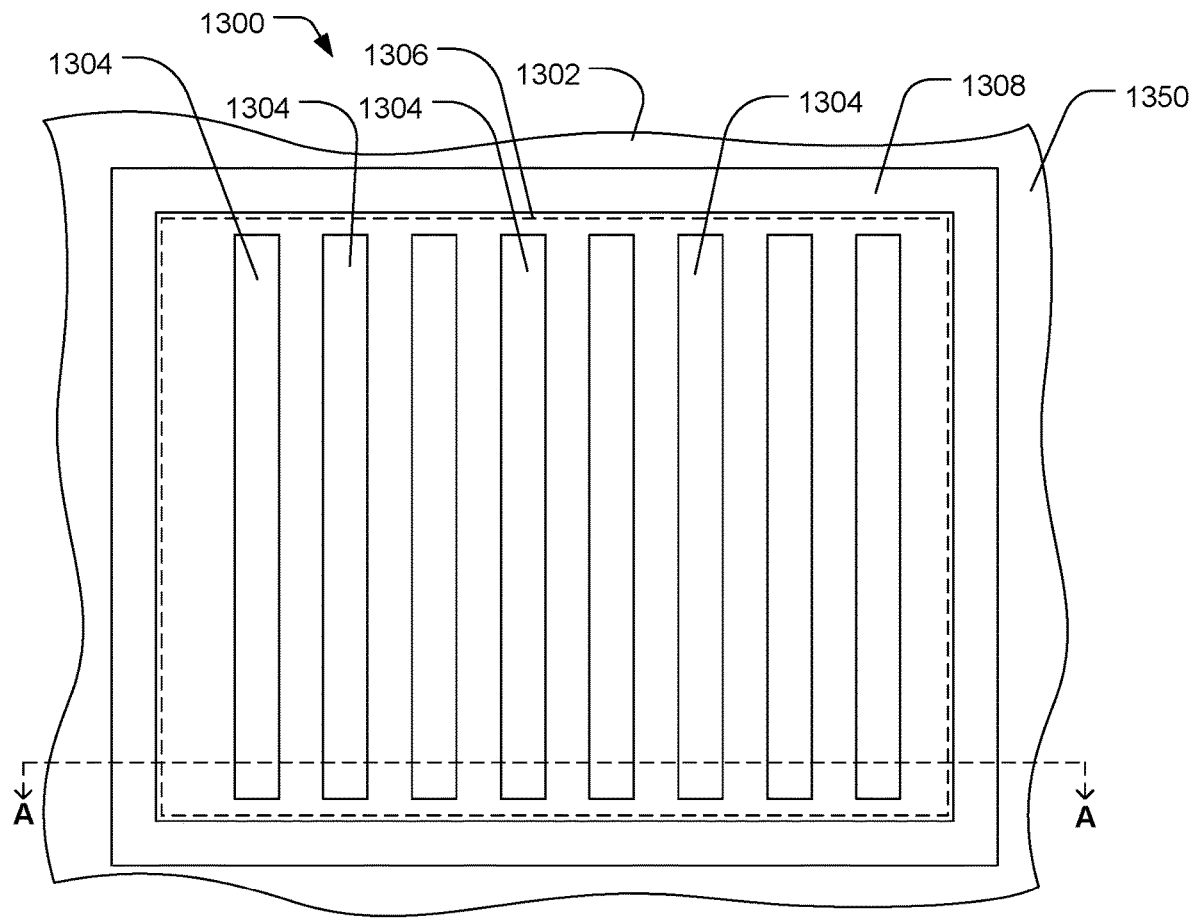
FIG. 14 includes an illustration of a plan view of an example radiation protected substrate workpiece, similar to the workpiece illustrated in FIG. 13.

In a further example, a buried radiation protection layer can be embedded within a bulk material of a substrate. For example, FIG. 13 and FIG. 14 illustrate embodiments in which a buried radiation protection layer 1306 is embedded in the bulk material of a substrate 1302 and underlies a device layer 1310. For example, the substrate 1302 can be formed a bulk material, such as silicon or other semiconductor materials. The radiation protection layer 1306 can be formed in or on the substrate 1302, and a device layer 1310, formed of a semiconductor material such as silicon, can be disposed over the buried radiation protection layer 1306. The buried radiation protection layer 1306 can extend across the substrate 1302. Alternatively, insulator wells 1308 can be formed to surround the sides of the buried radiation protection layer 1306 as illustrated in the plan view of FIG. 14. While FIG. 14 illustrates the insulator wells 1308 being slightly offset from the radiation protection layer 1306 in a plan view, preferably, the radiation protection layer 1306 and insulator wells are contiguous or the radiation protection layer 1306 extends into the insulator wells 1308.

The device layer 1310 can have a thickness in a range of 50 nm to 200 μm, such as a range of 50 nm to 3 μm. Implants can be formed in the device layer 1310. For example, as illustrated source/drain row implants 1304 can be formed within the device layer 1310 and can be disposed over the buried radiation protection layer 1306.

The buried radiation protection layer 1306 can be formed of radiation resistant material incorporating boron. For example, radiation resistant material can include boron in an isotope composition of at least 90% boron-11. The isotope composition is expressed as a percentage of atoms of a particular isotope. For example, the isotope composition can be at least 95% boron-11, such as at least 97% boron-11, or at least 99% boron-11. In a further example, the isotope composition is at least 99.5% boron-11, such as at least 99.7% boron-11, or even at least 99.9% boron-11.

In an example, the radiation resistant material can include borosilicate glasses, boron-doped phosphosilicate glass, or a boron ceramic material, such as boron oxide, boron nitride, boron carbide, or a combination thereof. In an example, the radiation resistant material includes a phosphosilicate glass that is selectively implanted with boron-11 after the phosphosilicate glass is formed by chemical vapor deposition (CVD). In particular, the radiation resistant material is a boron ceramic, such as boron oxide, boron nitride, boron carbide, or a combination thereof. For example, the radiation resistant material is boron oxide. In another example, the radiation resistant material is boron nitride. In a further example, the radiation resistant material is boron carbide.

The insulator wells 1308 can be formed of an insulating material such as silicon dioxide or can be formed of an insulator material having radiation protection properties such as borosilicate glasses, boron-doped phosphosilicate glass, or a boron ceramic material, such as boron oxide, boron nitride, boron carbide, or a combination thereof. In particular, the insulator material is a boron ceramic, such as boron oxide, boron nitride, boron carbide, or a combination thereof. For example, the insulator material is boron oxide. In another example, the insulator material is boron nitride. In a further example, the insulator material is boron carbide. In an example, the insulator material include boron-11 at an isotope composition as described above in relation to the radiation resistant material.

A wafer substrate, such as the substrate 102, can be formed to include the radiation protection layer 1306 and the device layer 1310 utilizing various techniques similar to those used to form silicon-on-insulator wafers. In an example, a buried borosilicate glass layer can be formed by utilizing high-energy implantation of oxygen and boron-11. In another example, a wafer bonding technique can be utilized in which the buried radiation protection layer is formed over the first wafer. A second wafer is bonded to the exposed surface of the radiation protection material, and optionally one or both substrate wafers are cut. For example, one wafer may be cut using a SmartCut™ technology. In a further example, the buried radiation protection layer can be formed over the surface of a substrate and a subsequent device layer can be grown over the radiation protection layer.

Following implantation of the source/drain rows 1304, devices such as those illustrated in FIG. 8, FIG. 9, FIG. 10, or FIG. 11 can be formed over the surface 1350 of the substrate 1302. As such, devices can be protected from radiation impinging above, and radiation impinging from below the substrate.

In a first embodiment, a semiconductor component includes a substrate including a plurality of source/drain implants in the form of rows and a charge storage structure disposed over the substrate. The charge storage structure comprises at least three continuous layers including a first silicon oxide layer, a silicon nitride layer disposed on the first silicon oxide layer, and a second silicon oxide layer disposed on the silicon nitride layer. The semiconductor component further includes a plurality of gate structures in the form of columns disposed over the charge structure and extending perpendicular to the rows and a radiation protection layer disposed over the charge storage structure and the plurality of gate structures. The radiation protection layer includes a radiation resistant material including boron having an isotope composition of at least 90% boron-11.

In an example of the first embodiment, the isotope composition is at least 95% boron-11. For example, the isotope composition is at least 97% boron-11, such as at least 99% boron-11, at least 99.5% boron-11, at least 99.7% boron-11, at least 99.9% boron-11, or even at least 99.97% boron-11.

In another example of the first embodiment and the above examples, the radiation resistant material includes boron oxide, boron nitride, boron carbide, or a combination thereof. For example, the radiation resistant material is boron oxide. In another example, the radiation resistant material is boron nitride.

In a further example of the first embodiment and the above examples, the substrate is a p-type substrate. For example, the source/drain implants are n-type implants.

In an additional example of the first embodiment and the above examples, the plurality of gate structures include polycrystalline silicon. For example, the polycrystalline silicon is a doped polycrystalline silicon.

In another example, the plurality of gate structures include a silicide layer.

In a further example of the first embodiment and the above examples, the charge storage structure includes two charge storage regions disposed along each gate and between each pair of source/drain implants.

In an additional example of the first embodiment and the above examples, the substrate includes a buried radiation protection layer and a device layer disposed over the buried radiation protection layer, the plurality of source/drain implants disposed in the device layer and over the radiation protection layer. For example, the semiconductor component further includes an insulator well disposed around the sides/edges of the buried radiation protection layer.

In a second embodiment, a method for forming a semiconductor component includes implanting a set of source/drain rows in a substrate; forming a continuous charge storage structure over the substrate and the set of source/drain rows; forming a plurality of gate columns over the continuous charge storage structure, the gate columns extending perpendicular to the rows; and depositing a radiation resistant material over the gate columns and the continuous charge storage structure, the radiation resistant material surrounding each gate column of the plurality of gate columns on at least three sides, the radiation resistant material including boron having a isotope composition of at least 90% boron-11.

In an example of the second embodiment, forming the continuous charge storage structure includes forming a first silicon oxide layer; forming a silicon nitride layer over the first silicon oxide layer; and forming a second silicon oxide layer over the silicon nitride layer.

In another example of the second embodiment and the above examples, forming the plurality of gate columns includes forming a gate material layer and etching the gate material layer to form the plurality of gate columns. In an example, the gate material layer includes polycrystalline silicon. In another example, the method further includes doping the plurality of gate columns. In an additional example, the method further includes forming a silicide on the gate columns.

In a further example of the second embodiment and the above examples, the isotope composition is at least 95% boron-11. For example, the isotope composition is at least 97% boron-11, such as at least 99% boron-11, at least 99.5% boron-11, at least 99.7% boron-11, at least 99.9% boron-11, or at least 99.97% boron-11.

In an additional example, the radiation resistant material includes boron oxide, boron nitride, boron carbide, or a combination thereof. For example, the radiation resistant material is boron oxide. In another example, the radiation resistant material is boron nitride.

In another example, the substrate includes a buried radiation protection layer and a device layer disposed over the buried radiation protection layer, the plurality of source/drain implants disposed in the device layer and over the radiation protection layer. For example, the substrate further includes an insulator well disposed around the sides/edges of the buried radiation protection layer.

In a third embodiment, a semiconductor component includes a substrate including a buried radiation protection layer and a device layer disposed over the radiation protection layer. The device layer includes a plurality of source/drain implants in the form of rows. The buried radiation protection layer includes a radiation resistant material including boron having an isotope composition of at least 90% boron-11. The semiconductor component includes a charge storage structure disposed over the substrate. The charge storage structure comprises at least three continuous layers including a first silicon oxide layer, a silicon nitride layer disposed on the first silicon oxide layer, and a second silicon oxide layer disposed on the silicon nitride layer. The semiconductor component further includes a plurality of gate structures in the form of columns disposed over the charge structure and extending perpendicular to the rows and a layer disposed over the charge storage structure and the plurality of gate structures.

In an example of the third embodiment, the isotope composition is at least 95% boron-11. For example, the isotope composition is at least 97% boron-11, such as at least 99% boron-11, at least 99.5% boron-11, at least 99.7% boron-11, at least 99.9% boron-11, or at least 99.97% boron-11.

In another example of the third embodiment and the above examples, the radiation resistant material includes boron oxide, boron nitride, boron carbide, or a combination thereof. For example, the radiation resistant material is boron oxide. In another example, the radiation resistant material is boron nitride.

In an additional example of the third embodiment and the above examples, the device layer is a p-type material.

In another example of the third embodiment and the above examples, the source/drain implants are n-type implants.

In a further example of the third embodiment and the above examples, the plurality of gate structures include polycrystalline silicon. For example, the polycrystalline silicon is a doped polycrystalline silicon. In an example, the plurality of gate structures include a silicide layer.

In an additional example of the third embodiment and the above examples, the charge storage structure includes two charge storage regions disposed along each gate and between each pair of source/drain implants.

In another example of the third embodiment and the above examples, the layer disposed over the charge storage structure and the plurality of gate structures includes a second radiation resistant material with an isotope composition of at least 90% boron-11.

In a further example of the third embodiment and the above examples, the second radiation resistant material is boron oxide.

In a fourth embodiment, a method for forming a semiconductor component includes implanting a set of source/drain rows in a device layer of a substrate, the substrate including a buried radiation protection layer and the device layer disposed over the buried radiation protection layer, the radiation protection layer having an isotope composition of at least 90% boron-11; forming a continuous charge storage structure over the substrate and the set of source/drain rows; forming a plurality of gate columns over the continuous charge storage structure, the gate columns extending perpendicular to the rows; and depositing a radiation resistant material over the gate columns and the continuous charge storage structure, the radiation resistant material surrounding each gate column of the plurality of gate columns on at least three sides, the radiation resistant material including boron having a isotope composition of at least 90% boron-11.

In an example of the fourth embodiment, forming the continuous charge storage structure includes forming a first silicon oxide layer; forming a silicon nitride layer over the first silicon oxide layer; and forming a second silicon oxide layer over the silicon nitride layer.

In another example of the fourth embodiment and the above examples, forming the plurality of gate columns includes forming a gate material layer and etching the gate material layer to form the plurality of gate columns. For example, the gate material layer includes polycrystalline silicon. In an example, the method further includes doping the plurality of gate columns. In another example, the method further includes forming a silicide on the gate columns.

In a further example of the fourth embodiment and the above examples, the isotope composition is at least 95% boron-11. For example, the isotope composition is at least 97% boron-11, such as at least 99% boron-11, at least 99.5% boron-11, at least 99.7% boron-11, at least 99.9% boron-11, or at least 99.97% boron-11.

In an additional example of the fourth embodiment and the above examples, the radiation resistant material includes boron oxide, boron nitride, boron carbide, or a combination thereof. For example, the radiation resistant material is boron oxide. In another example, the radiation resistant material is boron nitride.

Embodiments of the above-described systems and methods provide particular technical advantages over conventional semiconductor components, including resistance to various radiation sources, such as neutron radiation. Such systems and components find particular use in applications in which exposure to neutron radiation is possible. Such systems and components are resistant to random neutron radiation that exists ambiently. In particular, such semiconductor components formed as described above can find use in electronics used in radioactive facilities, such as nuclear reactor facilities and equipment at risk of being exposed to radiation.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A semiconductor component comprising:
    a substrate including a plurality of source/drain implants in the form of rows;
    a charge storage structure disposed over the substrate, the charge storage structure comprising at least three continuous layers including a first silicon oxide layer, a silicon nitride layer disposed on the first silicon oxide layer, and a second silicon oxide layer disposed on the silicon nitride layer, wherein the charge storage structure includes two charge storage regions disposed along each gate and between each pair of source/drain implants;
    a plurality of gate structures in the form of columns disposed over the charge structure and extending perpendicular to the rows; and
    a radiation protection layer disposed over the charge storage structure and the plurality of gate structures, the radiation protection layer including a radiation resistant material including boron having an isotope composition of at least 90% boron-11.

2. The semiconductor component of claim 1, wherein the isotope composition is at least 95% boron-11.

3. The semiconductor component of claim 2, wherein the isotope composition is at least 97% boron-11.

4. The semiconductor component of claim 3, wherein the isotope composition is at least 99% boron-11.

5. The semiconductor component of claim 4, wherein the isotope composition is at least 99.5% boron-11.

6. The semiconductor component of claim 5, wherein the isotope composition is at least 99.7% boron-11.

7. The semiconductor component of claim 6, wherein the isotope composition is at least 99.9% boron-11.

8. The semiconductor component of claim 7, wherein the isotope composition is at least 99.97% boron-11.

9. The semiconductor component of claim 1, wherein the radiation resistant material includes boron oxide, boron nitride, boron carbide, or a combination thereof.

10. The semiconductor component of claim 9, wherein the radiation resistant material is boron oxide.

11. The semiconductor component of claim 9, wherein the radiation resistant material is boron nitride.

12. The semiconductor component of claim 1, wherein the substrate is a p-type substrate.

13. The semiconductor component of claim 12, wherein the source/drain implants are n-type implants.

14. The semiconductor component of claim 1, wherein the plurality of gate structures includes polycrystalline silicon.

15. The semiconductor component of claim 14, wherein the polycrystalline silicon is a doped polycrystalline silicon.

16. The semiconductor component of claim 1, wherein the plurality of gate structures includes a silicide layer.

17. The semiconductor component of claim 1, wherein the substrate includes a buried radiation protection layer and a device layer disposed over the buried radiation protection layer, the plurality of source/drain implants disposed in the device layer and over the radiation protection layer.

18. The semiconductor component of claim 17, further comprising an insulator well disposed around the sides/edges of the buried radiation protection layer.

19. A method for forming a semiconductor component, the method comprising:
    implanting a set of source/drain rows in a substrate;
    forming a continuous charge storage structure over the substrate and the set of source/drain rows;
    forming a plurality of gate columns over the continuous charge storage structure, the gate columns extending perpendicular to the rows; and
    depositing a radiation resistant material over the gate columns and the continuous charge storage structure, the radiation resistant material surrounding each gate column of the plurality of gate columns on at least three sides, the radiation resistant material including boron having an isotope composition of at least 90% boron-11.

20. The method of claim 19, wherein forming the continuous charge storage structure comprises:
    forming a first silicon oxide layer;
    forming a silicon nitride layer over the first silicon oxide layer; and forming a second silicon oxide layer over the silicon nitride layer.

* * * * *